(12) United States Patent
Kim et al.

(10) Patent No.: US 10,090,059 B2
(45) Date of Patent: Oct. 2, 2018

(54) ONE TIME PROGRAMMABLE MEMORY AND A DATA WRITING METHOD THEREOF

(71) Applicant: SAMSUNG ELECTRONICS CO., LTD., Suwon-si, Gyeonggi-do (KR)

(72) Inventors: Tae-Seong Kim, Yongin-si (KR); Hyun-Taek Jung, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/375,712

(22) Filed: Dec. 12, 2016

(65) Prior Publication Data

US 2017/0243660 A1 Aug. 24, 2017

(30) Foreign Application Priority Data

Feb. 24, 2016 (KR) .................. 10-2016-0022037

(51) Int. Cl.
*G11C 17/00* (2006.01)
*G11C 17/18* (2006.01)
*G11C 17/16* (2006.01)

(52) U.S. Cl.
CPC ............. *G11C 17/18* (2013.01); *G11C 17/16* (2013.01)

(58) Field of Classification Search
CPC ......... G11C 17/16; G11C 17/18; G11C 11/34; G11C 17/12; G11C 17/14; G11C 11/5692; G11C 11/56; G11C 11/5678; G11C 13/0004; G11C 13/0064; G11C 13/0069; G11C 16/0433; G11C 2013/0066; G11C 2013/009; G11C 2213/72

USPC .............. 365/148, 100, 104, 185.14, 185.21, 365/185.24, 185.28, 189.07, 189.08, 94, 365/154, 159, 161, 185.05

See application file for complete search history.

(56) References Cited

U.S. PATENT DOCUMENTS

| | | |
|---|---|---|
| 7,345,903 B2 | 3/2008 | Nakano et al. |
| 7,433,246 B2 | 10/2008 | Lee |
| 7,558,969 B1 | 7/2009 | Lucero et al. |
| 7,907,465 B2 | 3/2011 | Peng et al. |
| 8,120,974 B2 | 2/2012 | Matsufuji et al. |
| 8,149,607 B2 | 4/2012 | Scheuerlein et al. |
| 8,154,941 B2 | 4/2012 | Ito |
| 8,294,488 B1 * | 10/2012 | Derhacobian .......... H03K 19/02 365/148 |

(Continued)

FOREIGN PATENT DOCUMENTS

| | | |
|---|---|---|
| JP | 2002133879 | 5/2002 |
| KR | 100443360 | 8/2004 |

(Continued)

*Primary Examiner* — Thong Q Le
(74) *Attorney, Agent, or Firm* — F. Chau & Associates, LLC

(57) ABSTRACT

A one time programmable (OTP) memory includes an OTP cell array including a plurality of OTP cells provided at locations where a plurality of word lines and a plurality of bit lines cross each other, and a write circuit configured to sequentially program the OTP cells by selecting the bit lines one at a time and program a selected OTP cell connected to the selected bit line, wherein the write circuit is further configured to detect a voltage level of the selected bit line and select another bit line when the detected voltage level indicates that the selected OTP cell is in a programmed state.

20 Claims, 22 Drawing Sheets

(56) References Cited

U.S. PATENT DOCUMENTS

2014/0269135 A1 9/2014 Chung
2016/0148705 A1* 5/2016 Lee ..................... G11C 17/16
365/96

FOREIGN PATENT DOCUMENTS

KR 100995327 11/2010
KR 101147481 5/2012

* cited by examiner

US 10,090,059 B2

ONE TIME PROGRAMMABLE MEMORY AND A DATA WRITING METHOD THEREOF

CROSS-REFERENCE TO RELATED APPLICATION

This application claims priority under 35 U.S.C. § 119 to Korean Patent Application No. 10-2016-0022037, filed on Feb. 24, 2016, in the Korean Intellectual Property Office, the disclosure of which is incorporated by reference herein in its entirety.

TECHNICAL FIELD

The inventive concept relates to a one time programmable (OTP) memory and a data writing method of the OTP memory.

DISCUSSION OF RELATED ART

A one time programmable (OTP) memory may store data in a plurality of OTP cells each having an unprogrammed state or a programmed state. An OTP cell may retain data when power is cut off; however, a programmed OTP cell cannot be programmed again. For example, the OTP cell may include a fuse or an antifuse, and once the fuse or antifuse is programmed, the data in them is permanent. Due to this characteristic, the OTP memory is used in a variety of applications to store data.

SUMMARY

According to an exemplary embodiment of the inventive concept, there is provided a one time programmable (OTP) memory including an OTP cell array including a plurality of OTP cells provided at locations where a plurality of word lines and a plurality of bit lines cross each other, and a write circuit configured to sequentially program the OTP cells by selecting the bit lines one at a time and program a selected OTP cell connected to the selected bit line, wherein the write circuit is further configured to detect a voltage level of the selected bit line and select another bit line when the detected voltage level indicates that the selected OTP cell is in a programmed state.

According to an exemplary embodiment of the inventive concept, there is provided a data writing method of an OTP memory configured to write multibit input data in a plurality of OTP cells, the method including receiving the multibit input data and a write command, selecting one of a plurality of bit lines connected to the OTP cells, and writing a data value of the multibit input data in a selected OTP cell connected to the selected bit line, detecting a voltage level of the selected bit line, and selecting another of the bit lines when the detected voltage level indicates that the selected OTP cell is in a state corresponding to the data value.

According to an exemplary embodiment of the inventive concept, there is provided an OTP memory including an OTP cell array including a plurality of OTP cells provided at locations where a plurality of word lines and a plurality of bit lines cross each other, a row decoder configured to select one of the word lines in response to a row address, a column decoder configured to select m bit lines among the bit lines in response to a column address, and a write circuit configured to sequentially program m OTP cells (m is equal to or greater than 1) connected to the selected word line and the m selected bit lines, by selecting the m bit lines one at a time and programming a selected OTP cell connected to the selected bit line, wherein the write circuit is further configured to detect a voltage level of the selected bit line and select another bit line when the detected voltage level indicates that the selected OTP cell is in a programmed state.

According to an exemplary embodiment of the inventive concept, there is provided an OTP memory including a cell array comprising a plurality of cells, a plurality of wordlines and a plurality of bit lines; and a write circuit configured to program a first cell of a first bit line, generate a first program complete signal when a voltage level of a sensing node of the write circuit indicates the first cell has a logic high level, and program a second cell of a second bit line in response to the first program complete signal.

BRIEF DESCRIPTION OF THE DRAWINGS

The above and other features of the inventive concept will become more clearly understood by describing in detail exemplary embodiments thereof with reference to the accompanying drawings in which.

DETAILED DESCRIPTION OF THE EMBODIMENTS

Figure 1:
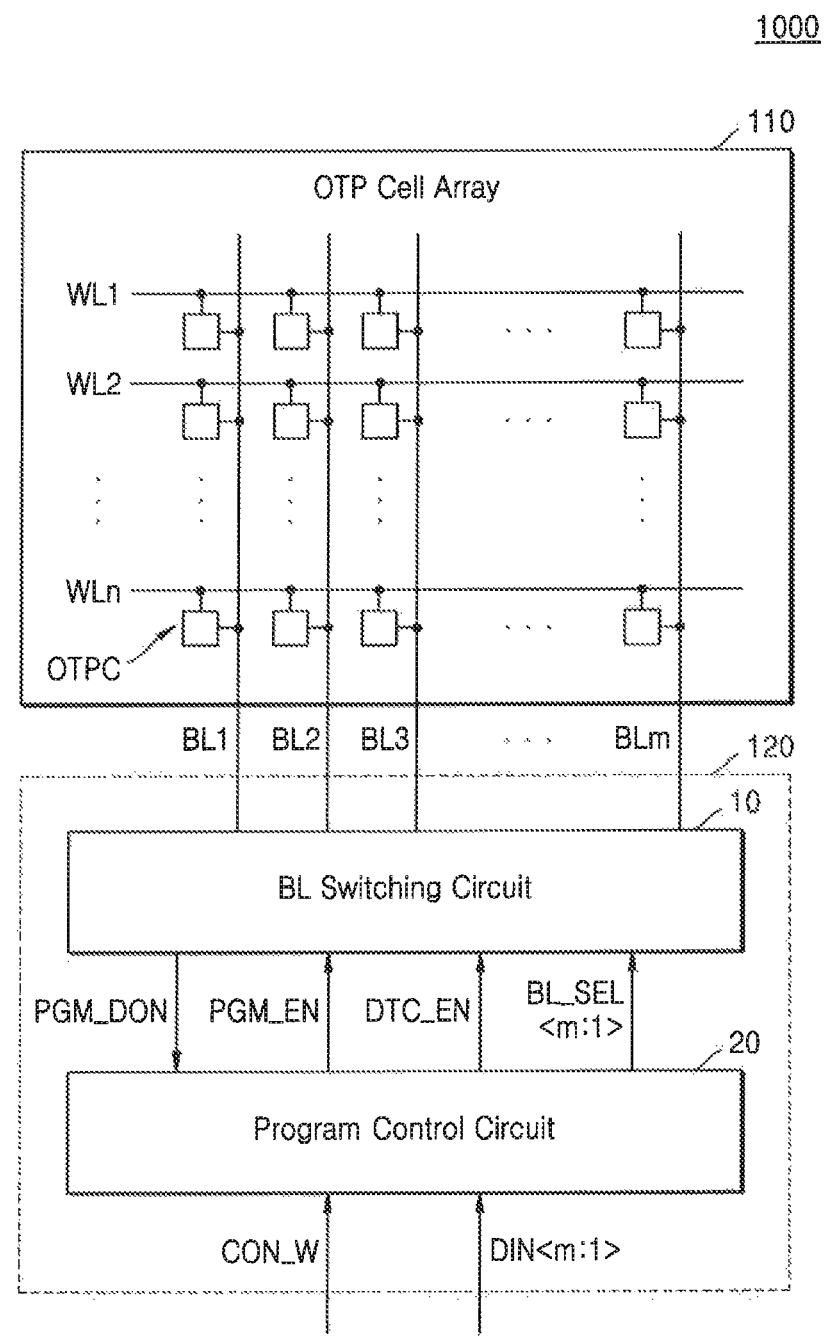
FIG. 1 is a block diagram of a one time programmable (OTP) memory according to an exemplary embodiment of the inventive concept.

FIG. 1 is a block diagram of a one time programmable (OTP) memory 1000 according to an exemplary embodiment of the inventive concept. The OTP memory 1000 is an independent memory device and may be implemented and packaged into a single chip by itself or may be implemented and packaged into a single chip (e.g., a system on chip (SoC)) together with another circuit, e.g., another memory, a processing core, etc.

Referring to FIG. 1, the OTP memory 1000 may include an OTP cell array 110 and a write circuit 120.

The OTP cell array 110 may include a plurality of OTP cells OTPC arranged in a plurality of rows and columns. The OTP cells OTPC may be connected to a plurality of word lines WL1 to WLn and a plurality of bit lines BL1 to BLm, and may be provided at locations where the word lines WL1 to WLn and the bit lines BL1 to BLm cross each other. Although each of the word lines WL1 to WLn is illustrated as a single line in FIG. 1, according to an exemplary embodiment of the inventive concept, each of the word lines WL1 to WLn may include two or more lines connected to the same OTP cells OTPC.

Figure 2A:
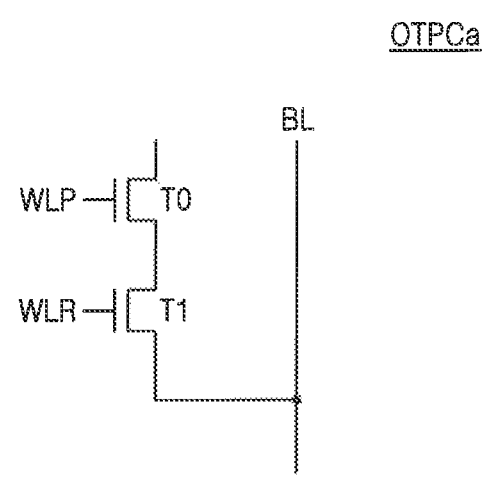
FIGS. 2A, 2B and 2C are circuit diagrams of OPT cells according to exemplary embodiments of the inventive concept.
Figure 2B:
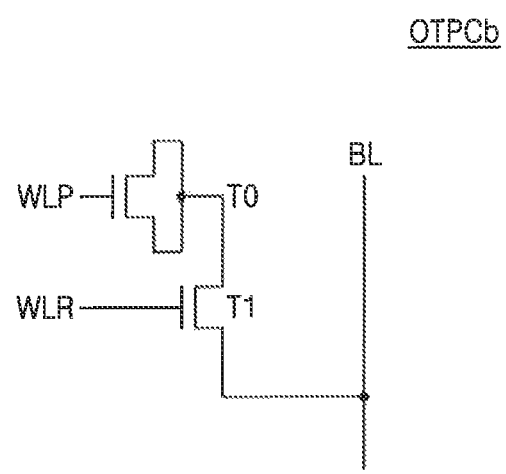
Figure 2C:
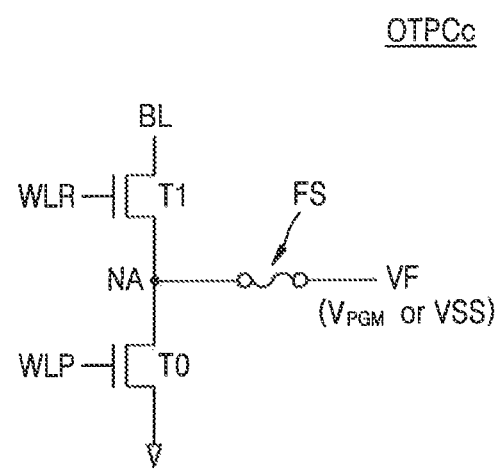

Each OTP cell OTPC may have a variety of cell structures as illustrated in FIGS. 2A, 2B and 2C. The OTP cell OTPC may have an unprogrammed state or a programmed state, and store data corresponding to the state thereof. In addition, the OTP cell OTPC may have multiple programmed states, and thus, store data corresponding to a plurality of bits. In the following description, it is assumed that the OTP cell OTPC has a single programmed state. For example, an unprogrammed OTP cell stores a data value '0', and a programmed OTP cell stores a data value '1'. However, the inventive concept is not limited thereto.

The write circuit 120 may write m-bit input data DIN<m:1> in a plurality of OTP cells OTPC connected to a word line selected among the word lines WL1 to WLn, in response to a write control signal CON_W. The least significant bit (LSB) of the input data may be denoted by DIN<1> and the most significant bit (MSB) of the input data, e.g., an m-th bit, may be denoted by DIN<m>. The write control signal CON_W may include a write command. The write control signal CON_W may also include control signals for setting a variety of write conditions. For example, the write control signal CON_W may set a total writing time (or a total programming time) of the write circuit 120, a unit writing time (or a unit programming time) for a write operation on one OTP cell, or a total number of write operations (or a total number of program cycles) on a plurality of OTP cells such that the m-bit input data DIN<m:1> is written in the OTP cell array 110.

The write circuit 120 may write the m-bit input data DIN<m:1> in m OTP cells OTPC by sequentially programming the OTP cells OTPC. The write control signal CON_W may include, for example, a write command. The write circuit 120 selects the bit lines BL1 to BLm one by one and programs a selected OTP cell OTPC connected to the selected bit line. In the following description, programming of a selected bit line may mean that a selected OTP cell connected to the selected bit line is programmed.

The write circuit 120 may include a bit line switching circuit 10 and a program control circuit 20. The bit line switching circuit 10 may select the bit lines BL1 to BLm one by one in response to a bit line selection signal BL_SEL<m:1>, detect a voltage level of the selected bit line, and generate a program completion signal PGM_DON based on the detected voltage level. The bit line switching circuit 10 may program an OTP cell OTPC of the selected bit line in response to a program enable signal PGM_EN provided from the program control circuit 20, and detect a voltage level of the selected bit line in response to a detection enable signal DTC_EN.

The program control circuit 20 may generate the bit line selection signal BL_SEL<m:1>, and change the bit line selection signal BL_SEL<m:1> in response to the program completion signal PGM_DON. In this case, the program control circuit 20 may generate the bit line selection signal BL_SEL<m:1> based on the input data DIN<m:1>. In other words, in response to the input data DIN<m:1>. In addition, the program control circuit 20 may generate the program enable signal PGM_EN and the detection enable signal DTC_EN based on the write control signal CON_W. In other words, in response to the write control signal CON_W. Detailed descriptions of the configuration and operation of the write circuit 120 will be given below with reference to FIGS. 4 to 7.

As described above, the write circuit 120 according to an exemplary embodiment of the inventive concept may write the multibit input data DIN<m:1> in the OTP cell array 110 in response to the write control signal CON_W. The write circuit 120 may program a plurality of OTP cells OTPC by detecting a voltage level of a selected bit line and selecting another bit line upon determining that a selected OTP cell OTPC is in a programmed state, based on the result of detection. As such, a time for programming one OTP cell OTPC may not be fixed but may vary based on characteristics of the OTP cell, e.g., whether the OTP cell is fast-programmable, normal-programmable, or slow-programmable. Accordingly, a total time for programming a plurality of OTP cells OTPC, e.g., a time for writing the input data DIN<m:1> in the OTP cell array 110 may be reduced. In addition, overprogramming of the OTP cells OTPC may be prevented.

FIGS. 2A, 2B and 2C are circuit diagrams of OPT cells OTPCa, OTPCb, and OTPCc according to exemplary embodiments of the inventive concept. For example, FIGS. 2A and 2B show antifuse-type OTP cells, and FIG. 2C shows a fuse-type OTP cell.

Referring to FIGS. 2A and 2B, each of the OTP cells OTPCa and OTPCb may include a program transistor T0 and a read transistor T1. The program transistor T0 is an antifuse device and has a structure capable of changing its conduction state. For example, such an antifuse device may change from a non-conductive state to a conductive state, and from a high-resistance state to a low-resistance state in response to an electrical stress such as a programming voltage or current. The programming voltage may be applied in the form of a pulse for several to several ten μs. The antifuse device may be implemented with a capacitor structure, or may be implemented with a transistor structure as in the current embodiment.

A gate of the program transistor T0 may be connected to a program word line WLP. As illustrated in FIG. 2A, a source of the program transistor T0 may be connected to a drain of the read transistor T1, and a drain of the program transistor T0 may be floated. As illustrated in FIG. 2B, the source and the drain of the program transistor T0 may be connected to each other.

A gate of the read transistor T1 may be connected to a read word line WLR. In FIG. 2A, the drain of the read transistor T1 may be connected to the source of the program transistor T0, and a source of the read transistor T1 may be connected to a bit line BL. Referring to FIG. 2B, the drain of the read transistor T1 may be connected to the source and the drain of the program transistor T0 and the source of the read transistor T1 may be connected to the bit line BL. The read transistor T1 may perform a switching function. When an operation voltage is applied to the gate of the read transistor T1 through the read word line WLR, the read transistor T1 may be turned on.

Before a program voltage is applied to the gate of the program transistor T0, a high-resistance state is maintained between the gate and the source of the program transistor T0 by a gate oxide layer. Accordingly, when a certain voltage is applied to the gate of the program transistor T0 and the bit line BL and the operating voltage is applied to the gate of the read transistor T1, the magnitude of a current flowing through the bit line BL is relatively very small.

When a high voltage, e.g., the program voltage, is applied to the gate of the program transistor T0 through the program word line WLP, the gate oxide layer is broken down and a current path is formed between the gate and the source of the program transistor T0. As such, the high-resistance state between the gate and the source may be transited to a low-resistance state. When the program transistor T0 is in the low-resistance state as described above, if the certain voltage is applied to the gate of the program transistor T0 and the bit line BL and the operating voltage is applied to the gate of the read transistor T1, the magnitude of a current flowing through the bit line BL may be relatively large. In this way, the OTP cells OTPCa and OTPCb may store data by applying a program voltage of a high voltage.

Referring to FIG. 2C, the OTP cell OTPCc may include a program transistor T0, a read transistor T1, and a fuse FS. The fuse FS is a device which can be opened at two ends thereof or can be changed to a high-resistance state when a high voltage is applied to the two ends. For example, electromigration may occur when the high voltage is applied to the two ends of the fuse FS, and thus, the fuse FS may have a high resistance value.

The read transistor T1 is connected between a bit line BL and a first node NA, and a read word line WLR is connected to a gate of the read transistor T1. The program transistor T0 is connected between the first node NA and ground, and a program word line WLP is connected to a gate of the program transistor T0. The fuse FS is connected between the first node NA and a control voltage VF. The fuse FS may be an electronic fuse (e.g., an E-fuse).

In a program operation, a voltage may be applied to the program word line WLP and a program voltage Vpgm of a high voltage may be applied to the fuse FS. As such, the fuse FS may be cut (e.g., opened) due to a current flowing toward the ground. The fuse FS may have a high resistance value when it is programmed with data.

In a read operation, a voltage may be applied to the read word line WLR and a ground voltage VSS may be applied as the control voltage VF of the fuse FS. As such, a path of a current flowing through the bit line BL, the read transistor T1, and the fuse FS may be formed. In this case, a different voltage level of the bit line BL may be output based on whether the programmed fuse FS is cut, and thus, data may be read.

Descriptions of the OTP cells OTPCa, OTPCb, and OTPCc have been given above with reference to FIGS. 2A to 2C. However, the OTP cells OTPCa, OTPCb, and OTPCc are examples, and an OTP memory according to an exemplary embodiment of the inventive concept may include OTP cells having a structure different from those of the OTP cells OTPCa, OTPCb, and OTPCc of FIGS. 2A to 2C. In the following description, it is assumed that an OTP memory according to an exemplary embodiment of the inventive concept includes the antifuse-type OTP cells of FIG. 2A.

Figure 3:
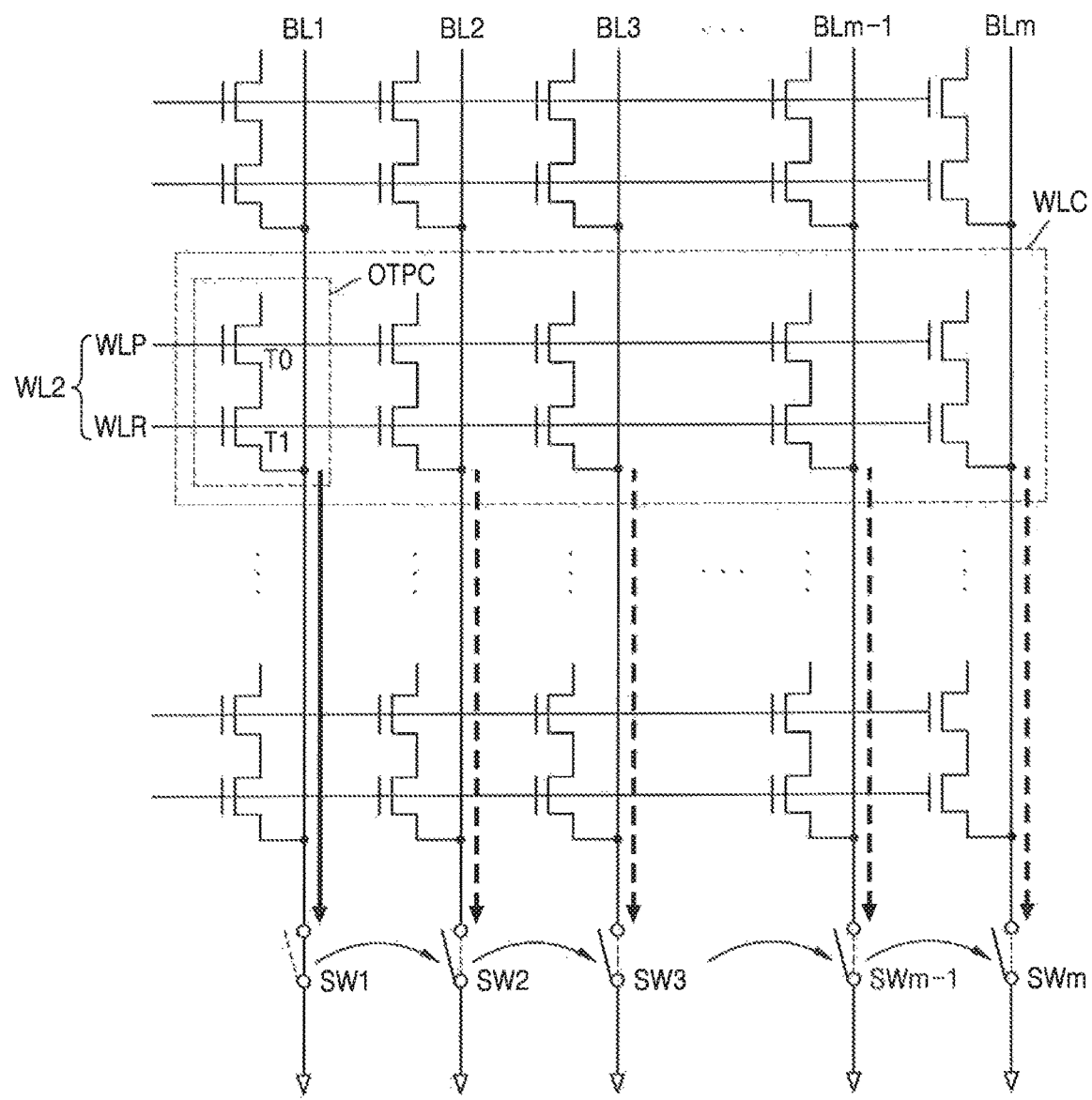
FIG. 3 is a circuit diagram for describing a data writing method of an OTP memory, according to an exemplary embodiment of the inventive concept.

FIG. 3 is a circuit diagram for describing a data writing method of an OTP memory, according to an exemplary embodiment of the inventive concept. The data writing method of FIG. 3 may be performed by the OTP memory 1000 of FIG. 1.

Referring to FIG. 3, a plurality of bit lines BL1 to BLm may be connected to a plurality of switches SW1 to SWm, respectively. The switches SW1 to SWm may be included in the bit line switching circuit 10 of the write circuit 120 of FIG. 1. One word line, e.g., a second word line WL2, may be selected and the input data DIN<m:1> of FIG. 1 may be written in a plurality of OTP cells OTPC connected to the second word line WL2. One of the switches SW1 to SWm may be turned on (e.g., closed) to select one bit line, and an OTP cell OTPC connected to the bit line may be programmed. If the OTP cell OTPC is completely programmed, another switch may be turned on to select another bit line.

For example, the first switch SW1 may be initially turned on to select the first bit line BL1. If the first bit line BL1 is completely programmed, the first switch SW1 may be turned off and the second switch SW2 may be turned on to select and program the second bit line BL2. In this manner, the first bit line BL1 to the m-th bit line BLm may be sequentially selected and programmed.

In this case, the bit line switching circuit 10 of FIG. 1 may generate a program completion signal PGM_DON by determining whether each bit line is completely programmed, and the program control circuit 20 may generate a bit line selection signal BL_SEL<m:1> for controlling the switches SW1 to SWm, in response to the program completion signal PGM_DON.

Figure 4:
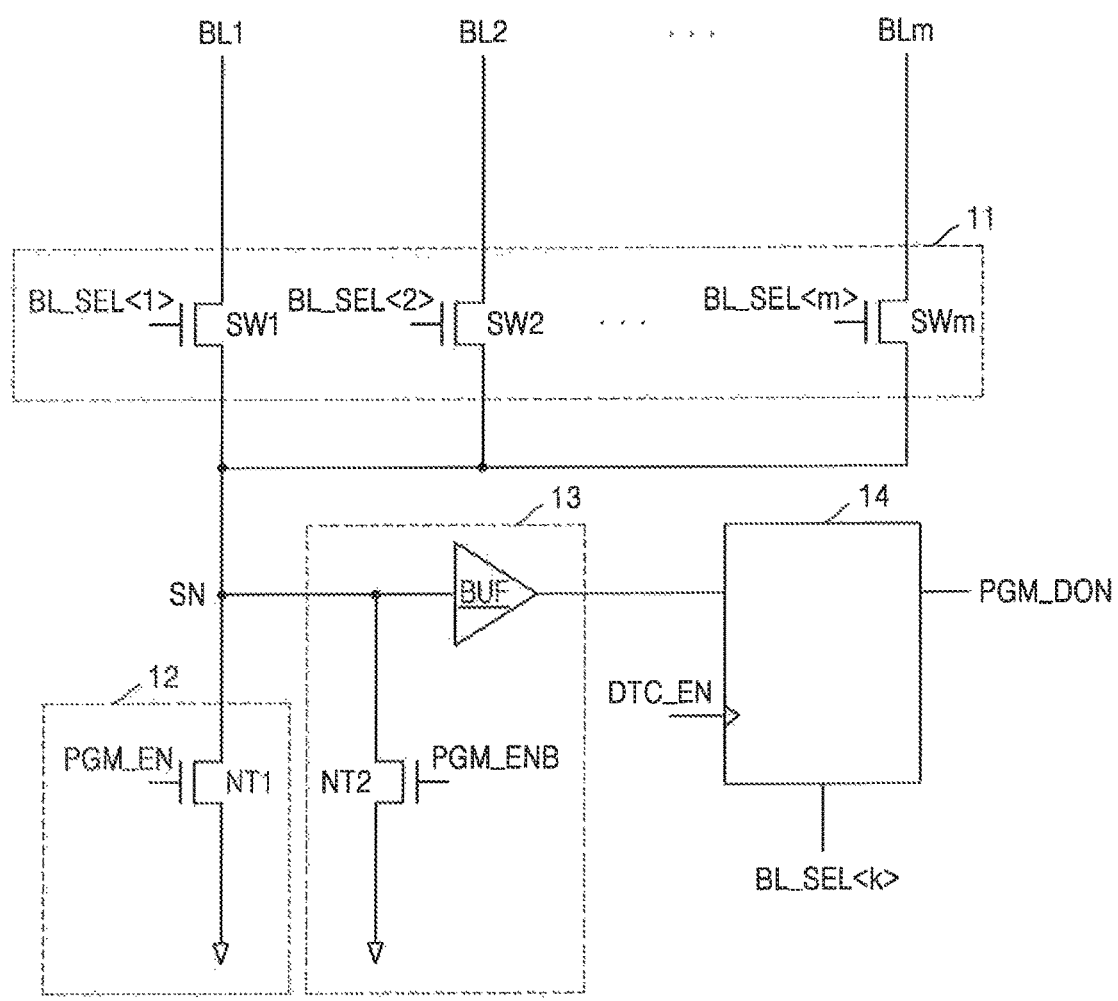
FIG. 4 is a circuit diagram of a write circuit according to an exemplary embodiment of the inventive concept.

FIG. 4 is a circuit diagram of a write circuit 10 according to an exemplary embodiment of the inventive concept. Referring to FIG. 4, the write circuit 10 may include a switch circuit 11, a current source 12, a self-level detector 13, and a logic circuit 14.

The switch circuit 11 may include a plurality of switches SW1 to SWm connected to a plurality of bit lines BL1 to BLm, respectively. According to an exemplary embodiment of the inventive concept, the switches SW1 to SWm may be metal-oxide semiconductor field-effect transistors (MOSFETs). Each of the switches SW1 to SWm may be turned on or off in response to a bit of a bit line selection signal BL_SEL<m:1 > corresponding thereto. In this case, one of the switches SW1 to SWm may be turned on to select one bit line.

The current source 12 may output a certain current (e.g., several ten to several hundred micro amperes (μA)) from the selected bit line. If a program enable signal PGM_EN is activated (e.g., a logic high state), a transistor NT1 may be turned on to form a current sink path, and the certain current may be output from the selected bit line. As such, a current may flow through a program transistor of a selected OTP cell OTPC, and thus, the selected OTP cell OTPC may be programmed. The current source 12 may be a current limiter.

The self-level detector 13 may detect a voltage level of the selected bit line in response to a program enable inversion signal PGM_ENB. The program enable inversion signal PGM_ENB may be an inverted version of the program enable signal PGM_EN. The self-level detector 13 may include a buffer BUF and a transistor NT2. The transistor NT2 may be turned on in response to the program enable inversion signal PGM_ENB, and may operate as a resistive element. If the selected OTP cell OTPC is completely programmed, a current having a relatively large magnitude may flow through the selected bit line. The current output from the selected bit line may flow through the transistor NT2, and a voltage level of a sensing node SN may be increased due to a resistive component of the transistor NT2. If the selected OTP cell OTPC is not programmed, a current having a relatively small magnitude may flow through the selected bit line, and thus, the voltage level of the sensing node SN may be low.

The buffer BUF may detect and amplify the voltage level of the sensing node SN, and output the amplified voltage. For example, if the voltage level of the sensing node SN is higher than a certain voltage level, the buffer BUF may output a high voltage corresponding to a logic high state, e.g., a power supply voltage. If the voltage level of the sensing node SN is lower than the certain voltage level, the buffer BUF may output a low voltage corresponding to a logic low state, e.g., a ground voltage.

The logic circuit 14 may output a program completion signal PGM_DON in response to a detection enable signal DTC_EN. The logic circuit 14 may receive the voltage level of the selected bit line, e.g., the output of the buffer BUF, as an input signal, and output the program completion signal PGM_DON if the input signal is in a logic high state.

When a data value '0' is stored in the selected OTP cell OTPC, the selected OTP cell OTPC does not need to be programmed and the voltage level of the selected bit line may be a low level. Since the selected OTP cell OTPC has a normal state corresponding to the stored data, the logic circuit 14 may generate the program completion signal PGM_DON. According to an exemplary embodiment of the inventive concept, the logic circuit 14 may receive a bit BL_SEL<k> of the bit line selection signal BL_SEL<m:1> corresponding to the selected bit line, and output the program completion signal PGM_DON irrespective of the voltage level of the selected bit line if the bit BL SEL<k> has a data value '0'.

According to an exemplary embodiment of the inventive concept, the program control circuit 20 may provide a bit line selection signal BL_SEL<m:1> for sequentially selecting only some of the bit lines BL1 to BLm connected to OTP cells OTPC to be programmed. As such, only the bit lines connected to the OTP cells OTPC for storing a data value '1', e.g., the OTP cells OTPC to be programmed, may be selected in response to the bit line selection signal BL_SEL<m:1>.

Figure 5:
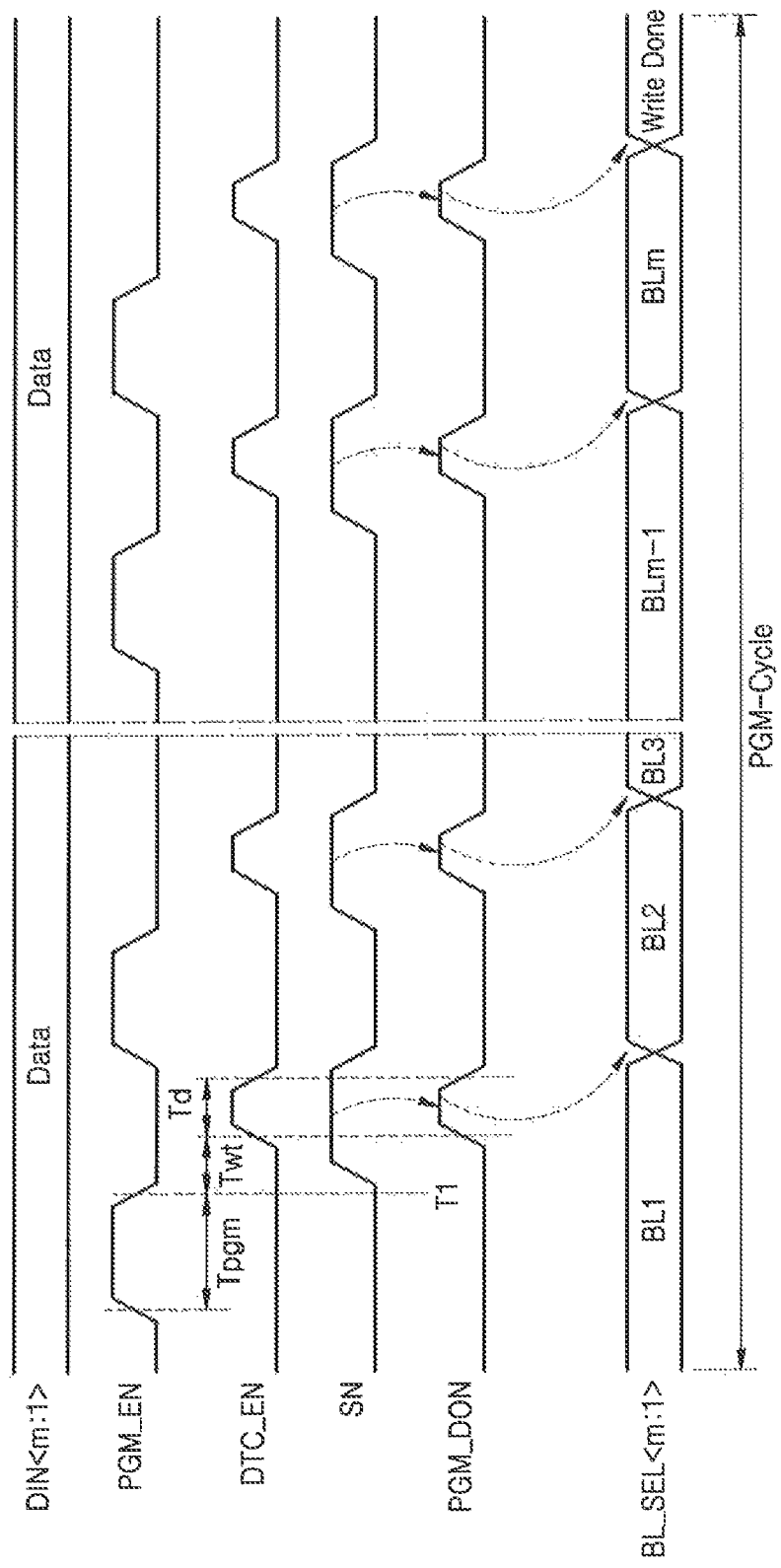
FIGS. 5 and 6 are timing diagrams of a write circuit according to an exemplary embodiment of the inventive concept.
Figure 6:
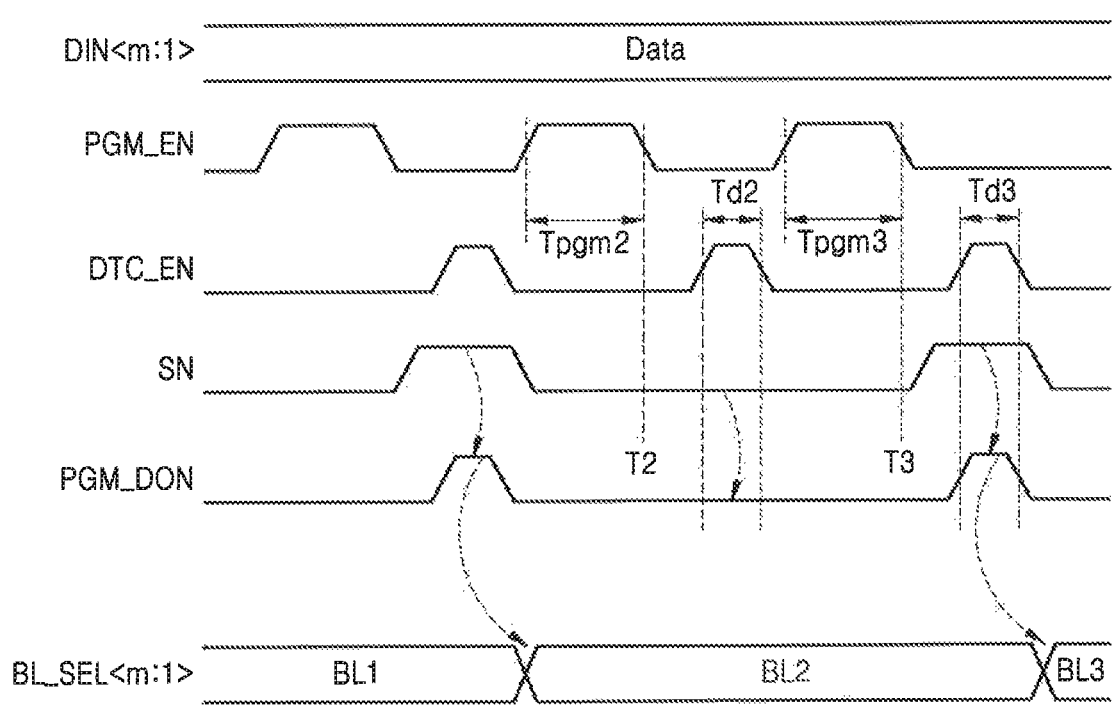

FIGS. 5 and 6 are timing diagrams of a write circuit according to an exemplary embodiment of the inventive concept. FIG. 5 is a timing diagram of one program cycle PGM_cycle, and FIG. 6 is a timing diagram of a case where a selected bit line is not completely programmed during a unit program period Tpgm.

Referring to FIG. 5, when input data DIN<m:1> and a write command are applied to the program control circuit 20 of FIG. 1, the program control circuit 20 may generate a program enable signal PGM_EN, a detection enable signal DTC_EN, and a bit line selection signal BL_SEL<m:1>. The bit line selection signal BL_SEL<m:1> may initially have a value for selecting a first bit line BL1. When the program enable signal PGM_EN is activated, an OTP cell OTPC of the first bit line BL1 may be programmed during a unit program period Tpgm. The unit program period Tpgm may be preset based on characteristics of the OTP cell OTPC. According to an exemplary embodiment of the inventive concept, the unit program period Tpgm may be set based on a time required to normally program (e.g., completely program) a normal cell. The unit program period Tpgm may be set to be shorter than a time required to program a slow cell (also referred to as a slow-programmable cell).

When the program enable signal PGM_EN is deactivated, a voltage of a sensing node SN may be increased. After a predetermined waiting time Twt, the detection enable signal DTC_EN may be activated. If a voltage level of the sensing node SN corresponds to a logic high state in a detection period Td, a program completion signal PGM_DON corresponding to a logic high state may be output from the bit line switching circuit 10 to the program control circuit 20. The bit line selection signal BL_SEL<m:1> may be increased to a value for selecting a second bit line BL2, in response to the program completion signal PGM_DON. In this way, in one program cycle PGM_cycle, first to m-th bit lines BL1 to BLm may be sequentially selected and programmed.

Referring to FIG. 6, after the first bit line BL1 is selected and completely programmed, the second bit line BL2 may be selected and programmed in a second unit program period Tpgm2. If the second bit line BL2 is not normally programmed, e.g., not completely programmed, the voltage level of the sensing node SN may correspond to a logic low state in a second detection period Td2. Accordingly, the program completion signal PGM_DON is not generated and the bit line selection signal BL_SEL<m:1> keeps the value for selecting the second bit line BL2. The second bit line BL2 may continue to be programmed in a third unit program period Tpgm3. If the second bit line BL2 is completely programmed and the voltage level of the sensing node SN corresponds to a logic high state, the program completion signal PGM_DON is generated in a third detection period Td3. The bit line selection signal BL_SEL<m:1>may be changed to a value for selecting a third bit line BL3, in response to the program completion signal PGM_DON.

In the above-described operation of the write circuit according to an exemplary embodiment of the inventive concept (e.g., the write circuit 120 of FIG. 1), a bit line may be programmed once or more than once until it is completely programmed, based on the unit program period Tpgm. As such, since a different programming time is applicable based on characteristics of each OTP cell OTPC, overprogramming of individual OTP cells OTPC may be prevented and a total programming time of a plurality of the OTP cells OTPC connected to a selected word line may be reduced. In addition, since the write circuit 120 autonomously detects a voltage level of a bit line and changes the value of the bit line selection signal BL_SEL<m:1>, an interface with an external device or a logic circuit of an OTP memory may be simplified.

Figure 7A:
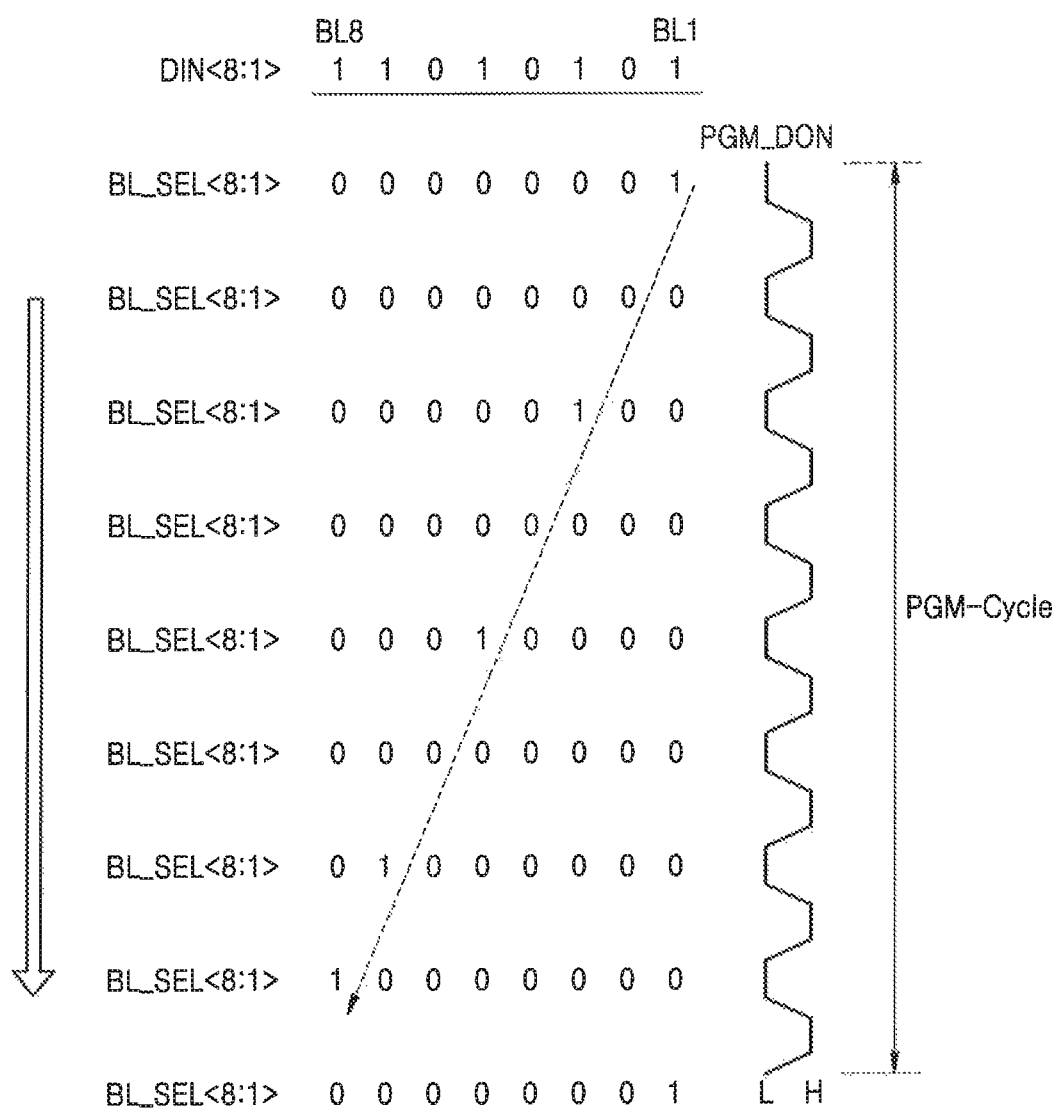
FIGS. 7A and 7B are diagrams showing examples of changing a value of a bit line selection signal based on input data in a write circuit, according to exemplary embodiments of the inventive concept.
Figure 7B:
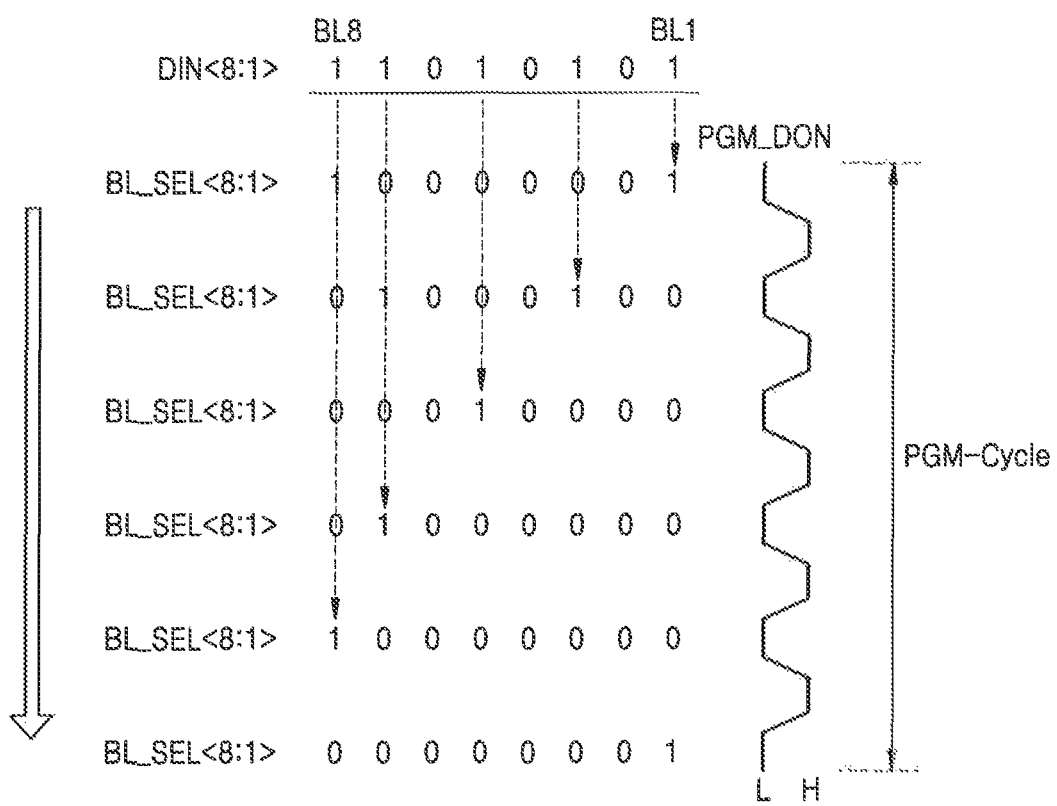

FIGS. 7A and 7B are diagrams showing examples of changing a value of a bit line selection signal based on input data in a write circuit, according to exemplary embodiments of the inventive concept. In the following description, it is assumed that the input data is 8-bit data.

The program control circuit 20 of FIG. 1 may change a value of a bit line selection signal BL_SEL<8:1> based on input data DIN<8:1> in response to a program completion signal PGM_DON, as illustrated in FIGS. 7A and 7B. Referring to FIG. 7A, the program control circuit 20 may select bits of the bit line selection signal BL_SEL<8:1> one by one in response to the program completion signal PGM_DON, and set the selected bit to a data value of a bit of the input data DIN<8:1> corresponding thereto. In this case, the other bits of the bit line selection signal BL_SEL<8:1> may be set to a data value '0'. In other words, when one bit of eight bits of the bit line selection signal BL_SEL<8:1> is set to correspond to a data value of a bit of the input data DIN<8:1>, the other seven bits of the bit line selection signal BL_SEL<8:1> are set to zero.

For example, initially, a first bit BL_SEL<1> of the bit line selection signal BL_SEL<8:1> may be set to a data value '1' of a first bit DIN<1> of the input data DIN<8:1> corresponding thereto. The other bits of the bit line selection signal BL_SEL<8:1>, e.g., BL_SEL<8:2>, may be set to a data value '0'. Thereafter, a second bit BL_SEL<2> of the bit line selection signal BL_SEL<8:1> may be set to a data value '0' of a second bit DIN<2> of the input data DIN<8:1> corresponding thereto, in response to the program completion signal PGM_DON.

Then, if the program completion signal PGM_DON is generated, a third bit BL_SEL<3> of the bit line selection signal BL_SEL<8:1> may be set to a data value '1' of a third bit DIN<3> of the input data DIN<8:1> corresponding thereto. As described above, the bit line selection signal BL_SEL<8:1> may be changed in such a manner that bits of the bit line selection signal BL_SEL<8:1> are sequentially set to data values of bits of the input data DIN<8:1> in response to the program completion signal PGM_DON.

Referring to FIG. 7B, the program control circuit 20 of FIG. 1 may generate a bit line selection signal BL_SEL<8:1> for sequentially selecting only bit lines to be programmed, in response to the program completion signal PGM_DON. Only first, third, fifth, seventh, and eighth bit lines BL1, BL3, BL5, BL7, and BL8 corresponding to bits of the input data DIN<8:1> having a data value '1' may be programmed. The program control circuit 20 may generate the bit line selection signal BL_SEL<8:1> for selecting the first bit line BL1 and then sequentially selecting the third, fifth, seventh, and eighth bit lines BL3, BL5, BL7, and BL8 in response to the program completion signal PGM_DON.

Figure 8:
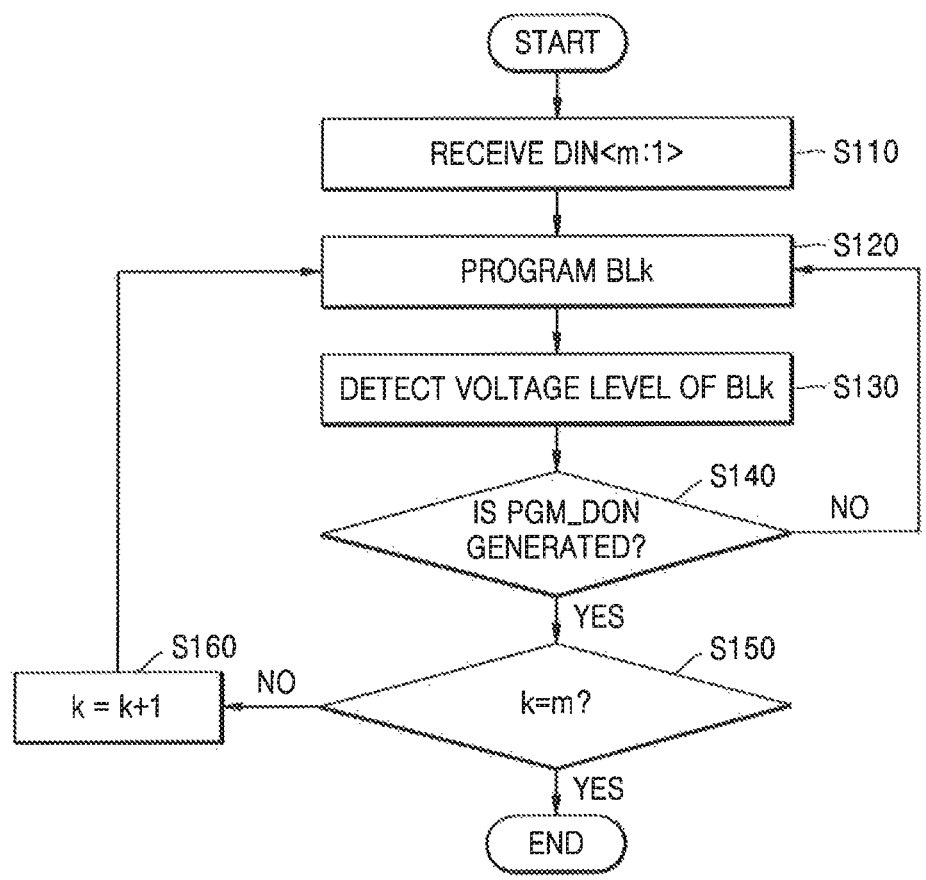
FIG. 8 is a flowchart of a data writing method of an OTP memory, according to an exemplary embodiment of the inventive concept.

FIG. 8 is a flowchart of a data writing method of an OTP memory, according to an exemplary embodiment of the inventive concept. FIG. 8 shows a method of programming m bit lines during one write cycle.

Referring to FIG. 8, input data DIN<m:1> having multiple bits may be received from an external device (S110). During a preset unit program period, a k-th bit line BLk (k is a natural number equal to or less than m) may be programmed (S120). In this case, a unit program period may be set to be shorter than a time required to normally program a slow cell among OTP cells. For example, the unit program period may be set to a time required to normally program a normal cell. In other words, the time required to program a slow cell is longer than the time required to program a normal cell. However, the unit program period is not limited thereto and may be set to various lengths of time.

After the k-th bit line BLk is programmed during the unit program period, a voltage level thereof is detected (S130). If the k-th bit line BLk is completely programmed, a program completion signal PGM_DON may be generated. If the k-th bit line BLk is not completely programmed, the program completion signal PGM_DON is not generated. Accordingly, if the program completion signal PGM_DON is not generated, the k-th bit line BLk may continue to be programmed.

If the program completion signal PGM_DON is generated, it may be determined whether the k-th bit line BLk is the last bit line to be programmed (S150). For example, when a first bit line BL1 to an m-th bit line BLm are sequentially programmed, it may be determined whether the k-th bit line BLk is the m-th bit line BLm.

If the k-th bit line BLk is the last bit line, programming may be terminated. As such, a program operation of one program cycle may be completed.

If the k-th bit line BLk is not the last bit line, a next bit line may be selected (S160). In other words, a bit line BLk+1 to be programmed next may be selected by increasing the value of k.

Thereafter, operations S120 to S150 may be repeated until all of the m bit lines are completely programmed.

Figure 9:
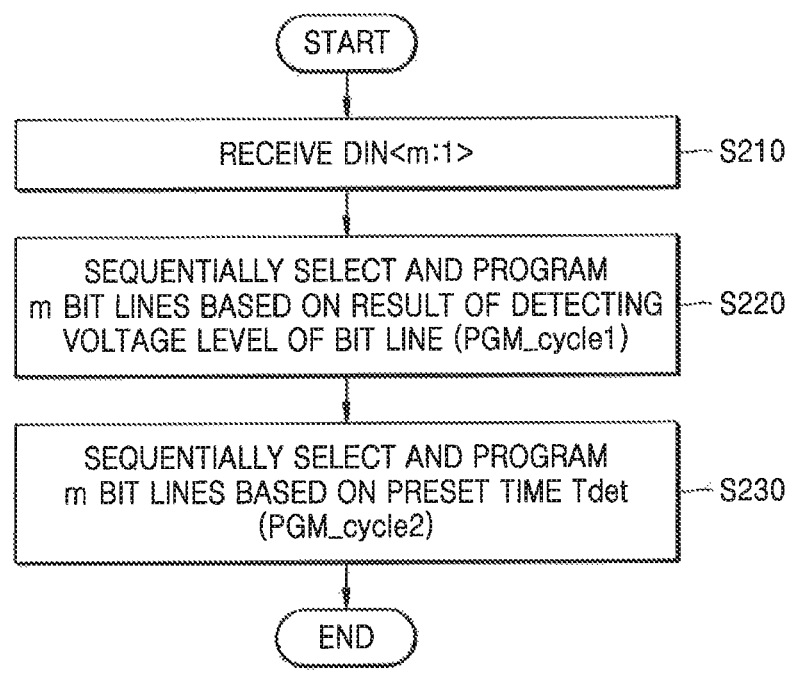
FIG. 9 is a flowchart of a data writing method of an OTP memory, according to an exemplary embodiment of the inventive concept.

FIG. 9 is a flowchart of a data writing method of an OTP memory, according to an exemplary embodiment of the inventive concept. FIG. 9 shows a method of programming a plurality of OTP cells multiple times. The OTP cells may be programmed during multiple program cycles to increase read characteristics of the OTP cells. In other words, a program operation of the OTP cells may be performed multiple times.

Referring to FIG. 9, input data DIN<m:1> having multiple bits may be received from an external device (S210). A plurality of bit lines, e.g., m bit lines, may be programmed in a first program cycle PGM_cycle_1 by using the data writing method described above with reference to FIG. 8 (S220).

Thereafter, the bit lines may be programmed again. The m bit lines may be sequentially selected and programmed based on a preset time Tdet during a second program cycle PGM_cycle2 (S230). Since the bit lines have been normally and completely programmed during the first program cycle PGM_cycle1, the bit lines may be programmed for a relatively short time during the second program cycle PGM_cycle2. The bit lines may be sequentially programmed based on the preset time Tdet without detecting a voltage level of each bit line. In this case, the preset time Tdet may be shorter than a time required to program a slow cell among OTP cells. According to an exemplary embodiment of the inventive concept, the preset time Tdet may be shorter than a time required to program a fast cell among OTP cells. A time to program a fast cell can be shorter than a time to program a normal cell, for example.

According to an exemplary embodiment of the inventive concept, operation S230 may be performed multiple times. In addition, according to an exemplary embodiment of the inventive concept, operation 5230 may be performed prior to operation S220. For example, after the input data DIN<m:1> is received, the m bit lines may be sequentially selected and programmed based on the preset time Tdet (S230) in the first program cycle PGM_cycle1. Then, a write circuit according to an exemplary embodiment of the inventive concept may detect a voltage level of each bit line and sequentially program the m bit lines based on the detection result as described above with reference to FIGS. 1 to 8 (S220), during the second program cycle PGM_cycle2.

Figure 10:
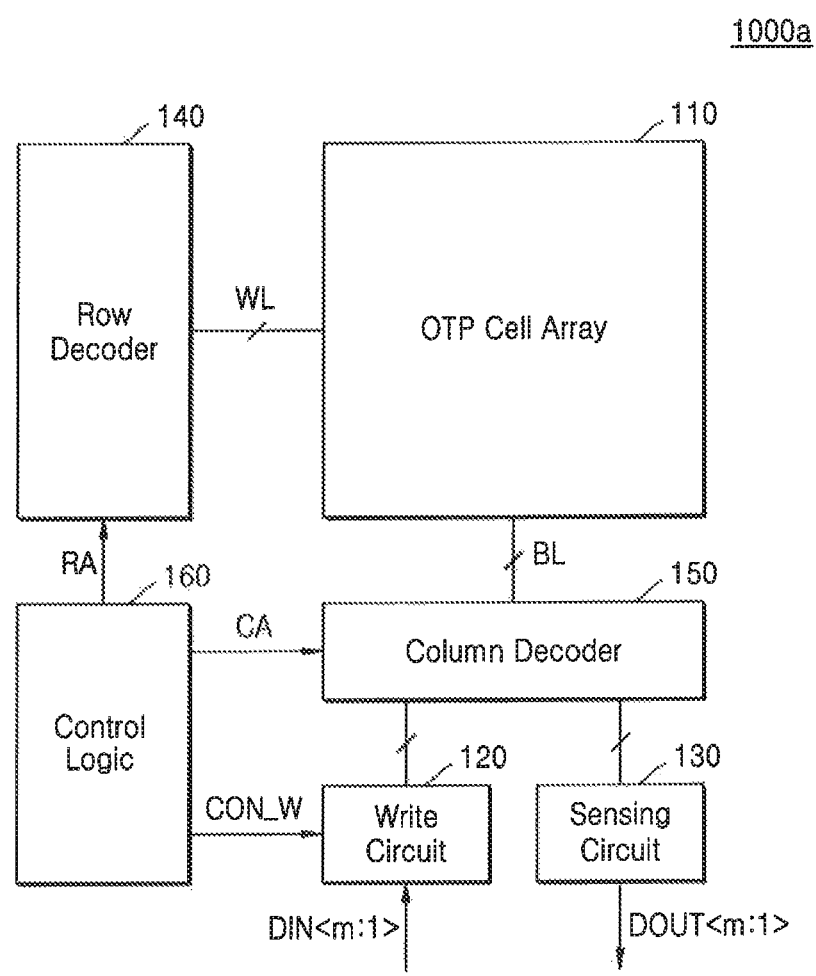
FIG. 10 is a block diagram of an OTP memory according to an exemplary embodiment of the inventive concept.

FIG. 10 is a block diagram of an OTP memory 1000a according to an exemplary embodiment of the inventive concept.

Referring to FIG. 10, the OTP memory 1000a may include an OTP cell array 110, a write circuit 120, a sensing circuit 130, a row decoder 140, a column decoder 150, and a control logic 160.

The OTP cell array 110 may include a plurality of OTP cells arranged in a plurality of rows and columns as described above with reference to FIG. 1.

The control logic 160 may control the overall operation of the OTP memory 1000a. The control logic 160 may control a write operation and a read operation of the OTP cell array 110 by controlling the row decoder 140, the column decoder 150, the write circuit 120, and the sensing circuit 130. The control logic 160 may provide a row address RA to the row decoder 140 and provide a column address CA to the column decoder 150 based on an address signal applied from an external device. In addition, the control logic 160 may transmit a write control signal CON__W to the write circuit 120 and transmit a read command CON__R to the sensing circuit 130.

According to an exemplary embodiment of the inventive concept, if the OTP memory 1000a is mounted in another device, e.g., a static random access memory (SRAM) or a system on chip (SoC), the control logic 160 may be a part of a control circuit of the device including the OTP memory 1000a.

The row decoder 140 may receive and decode the row address RA to select one of a plurality of word lines WL. The column decoder 150 may select a part of a plurality of bit lines BL of the OTP cell array 110 based on the column address CA. The selected bit line BL may be connected to the write circuit 120 or the sensing circuit 130.

The sensing circuit 130 may amplify a signal output from an OTP cell through the bit line BL, by detecting a voltage or a current of the bit line BL. As such, the sensing circuit 130 may output data stored in the OTP cell. The sensing circuit 130 may transmit read output data DOUT<m:1> to the outside of the OTP memory 1000a or to the control logic 160.

The write circuit 120 may receive input data DIN<m:1 > or the write control signal CON__W from the outside of the OTP memory 1000a or from the control logic 160. The write circuit 120 may be connected to the bit lines BL through the column decoder 150, and may write the input data DIN<m:1> in OTP cells of the bit lines BL. As described above with reference to FIGS. 1 to 8, the write circuit 120 may sequentially select and program the bit lines BL connected thereto through the column decoder 150. When each bit line BL is programmed, the write circuit 120 may detect a voltage level of the bit line BL to determine whether the bit line BL is completely programmed. If the bit line BL is completely programmed, the write circuit 120 may select another bit line BL to be programmed next. Since the operation for detecting the voltage level of each bit line BL and the operation for sequentially selecting the bit lines BL are performed by the write circuit 120, the control logic 160 may not provide a control signal for sequentially selecting the bit lines BL, to the write circuit 120. Accordingly, an interface between the control logic 160 and the write circuit 120 may be simplified.

Figure 11:
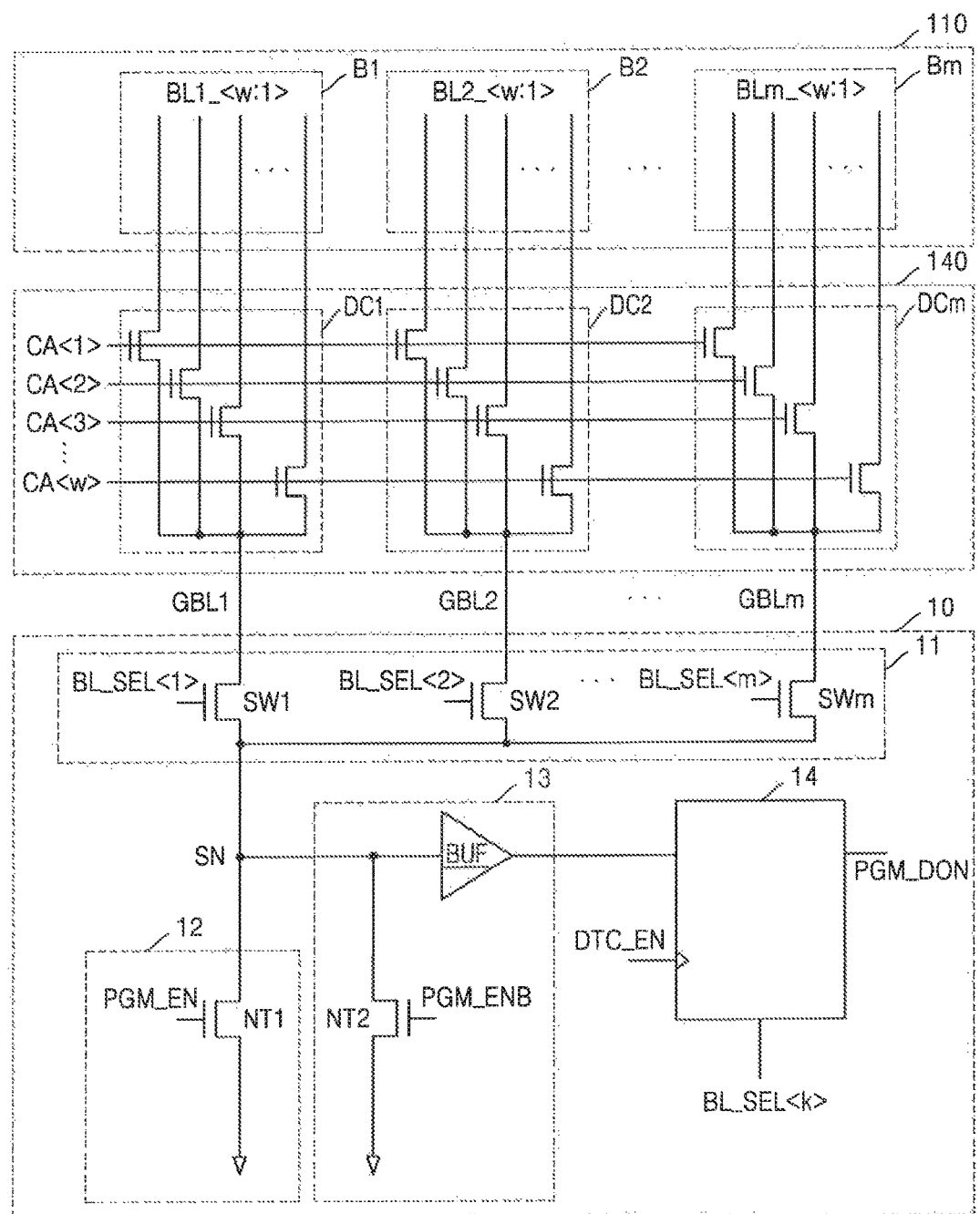
FIG. 11 is a circuit diagram showing a connection between a row decoder and a bit line switching circuit in the OTP memory of FIG. 10, according to an exemplary embodiment of the inventive concept.

FIG. 11 is a circuit diagram showing a connection between the row decoder 140 and a bit line switching circuit of the write circuit 120 (e.g., the bit line switching circuit 10 of FIG. 1) in the OTP memory 1000a of FIG. 10, according to an exemplary embodiment of the inventive concept.

Referring to FIG. 11, the row decoder 140 may include a plurality of decoding circuits DC1 to DCm each connected to a plurality of bit lines, e.g., W bit lines. Each of the decoding circuits DC1 to DCm may connect one of the bit lines to a global bit line GBL in response to a column address CA<w:1>. A plurality of global bit lines GBL1 to GBLm are connected to a plurality of switches SW1 to SWm of the switch circuit 11, respectively. As such, some of the plurality of bit lines BL1_<w:1>, BL2_<w:1>, . . . , BLm_<w:1>, which are selected by the row decoder 140, may be connected to the switch circuit 11. For example, referring to FIG. 11, m bit lines among w*m bit lines BL1_<w:1>, BL2_<w:1>, . . . , BLm_<w:1> may be connected to the switch circuit 11.

Referring back to FIG. 10, the control logic 160 may provide a column address CA<w:1> to the row decoder 140 when the write control signal CON_W is provided to the write circuit 120. The write circuit 120 may perform a multibit program operation for storing the input data DIN<m:1> of m bits in the bit lines, e.g., the m bit lines, selected by the column address CA<w:1>. If the input data DIN<m:1> is stored, the control logic 160 may provide a column address CA<w:1 > for selecting other m bit lines, to the row decoder 140, and provide the write control signal CON_W to the write circuit 120.

Figure 12:
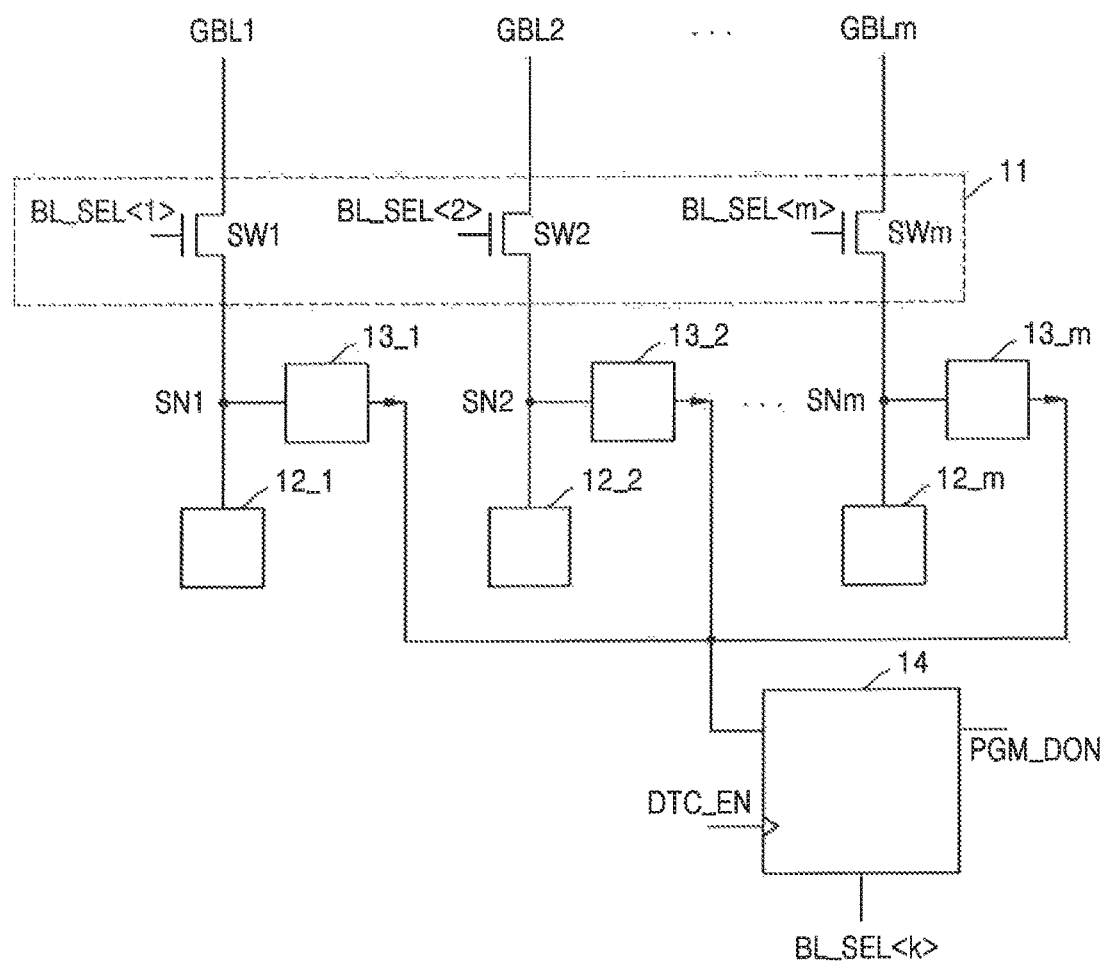
FIG. 12 is a circuit diagram of a write circuit according to an exemplary embodiment of the inventive concept.

FIG. 12 is a circuit diagram of a write circuit 10a according to an exemplary embodiment of the inventive concept. The write circuit 10a of FIG. 12 is applicable to the OTP memory 1000a of FIG. 10, and may be connected to bit lines of the OTP cell array 110 through the row decoder 140 as illustrated in FIG. 11.

Referring to FIG. 12, the global bit lines GBL1 to GBLm are connected to ends of the switches SW1 to SWm of the switch circuit 11, respectively. Other ends of the switches SW1 to SWm may be connected to current sources 12_1, 12_2, . . . , 12_m and self-level detectors 13_1, 13_2, . . . , 13_m, respectively. Outputs of the self-level detectors 13_1, 13_2, . . . , 13_m may be applied to the logic circuit 14.

The current sources 12_1, 12_2, . . . , 12_m may program the global bit lines GBL1 to GBLm by outputting certain currents therefrom, respectively, and the self-level detectors 13_1, 13_2, . . . , 13_m may detect voltage levels of the global bit lines GBL1 to GBLm and provide the result of detection to the logic circuit 14. However, since one of the switches SW1 to SWm is turned on based on a bit line selection signal BL_SEL<m:1>, the result of detection provided to the logic circuit 14 may actually be a result of detecting a voltage level of a selected one of the global bit lines GBL1 to GBLm.

Figure 13:
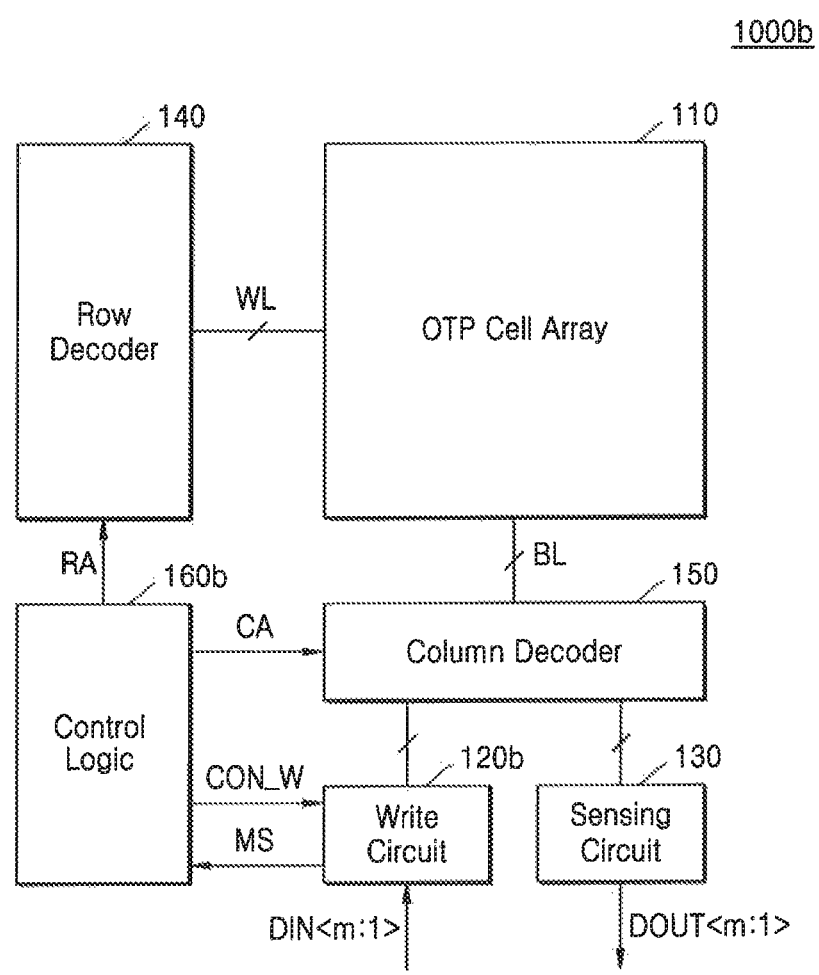
FIG. 13 is a block diagram of an OTP memory according to an exemplary embodiment of the inventive concept.

FIG. 13 is a block diagram of an OTP memory 1000b according to an exemplary embodiment of the inventive concept. The OTP memory 1000b of FIG. 13 is modified from the OTP memory 1000a of FIG. 10. The configuration and operation of the OPT memory 1000b of FIG. 13 are similar to those of the OTP memory 1000a of FIG. 10. Accordingly, repeated descriptions therebetween are not provided herein.

Referring to FIG. 13, a write circuit 120b may provide a monitoring signal MS to a control logic 160b. For example, the monitoring signal MS may include various types of information, e.g., the number of program operations required to completely program each bit line in each program cycle. The control logic 160b may monitor a program status of the OTP cell array 110 based on the monitoring signal MS, and change the number of program cycles, a unit programming time, a total programming time, or the like. In addition, the control logic 160b may change other program conditions based on the monitoring signal MS.

For example, the write circuit 120b may program the OTP cell array 110 based on a write control signal CON__W provided from the control logic 160b, according to the number of program cycles, the unit programming time, the total programming time, or the like. The control logic 160b may monitor the program status by using the monitoring signal MS, and change the number of program cycles, the unit programming time, the total programming time, or the like in such a manner that the program status of the OTP cell array 110 is optimized.

Figure 14A:
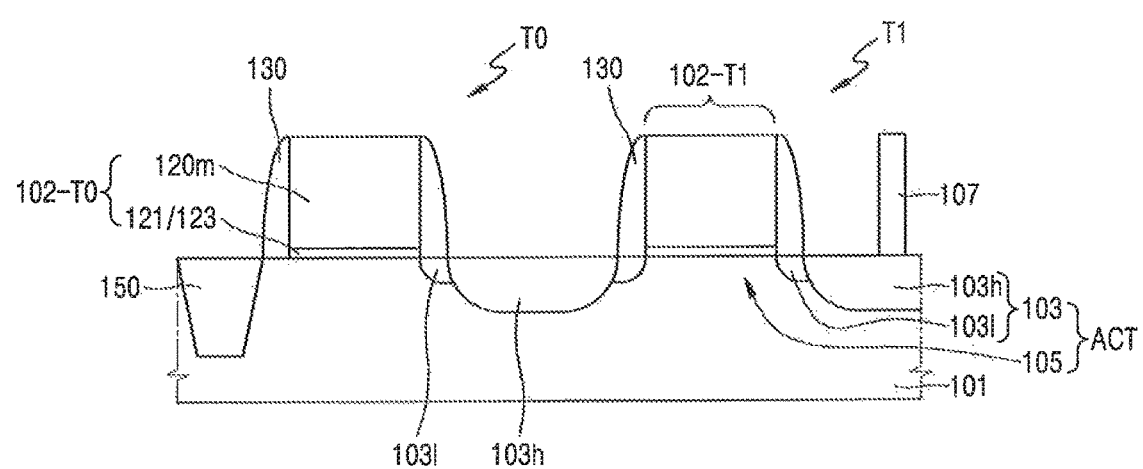
FIGS. 14A and 14B are cross-sectional and perspective views of OTP cells according to exemplary embodiments of the inventive concept.
Figure 14B:
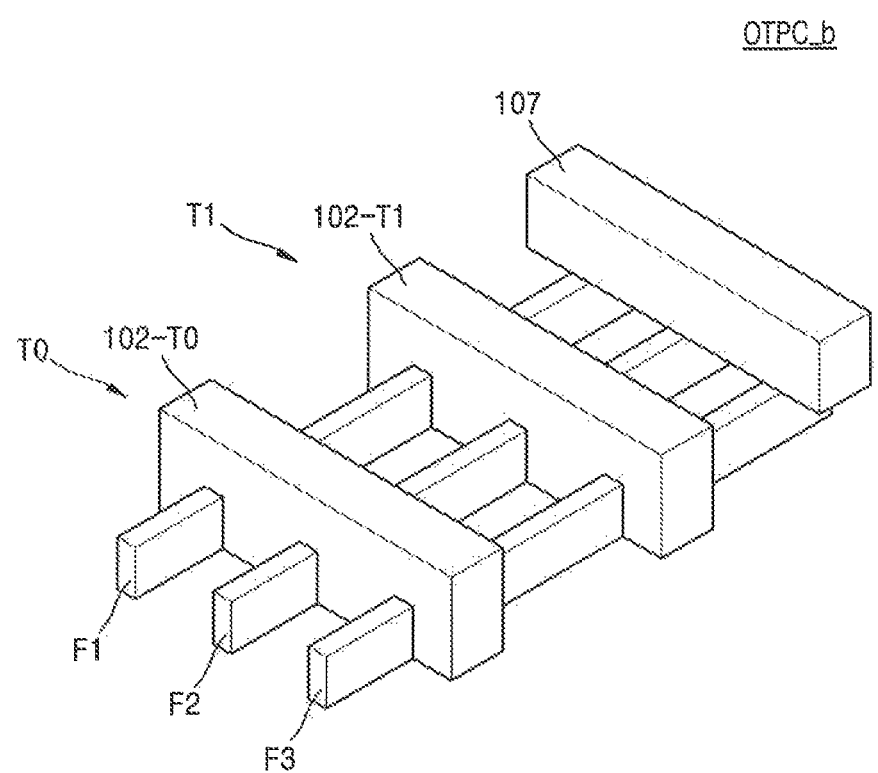

FIGS. 14A and 14B are cross-sectional and perspective views of OTP cells OTPC_a and OTPC_b according to exemplary embodiments of the inventive concept. FIG. 14A illustrates the OTP cell OTPC_a having a planer-type MOSFET structure, and FIG. 14B illustrates the OTP cell OTPC_b having a fin field effect transistor (FinFET)-type MOSFET structure.

Referring to FIG. 14A, a program transistor T0 and a read transistor T1 may be provided on a semiconductor substrate 101, and a pair of the program transistor T0 and the read transistor T1 may configure the OTP cell OTPC_a.

The semiconductor substrate 101 may be a silicon bulk wafer or a silicon-on-insulator (SOI) wafer. However, the semiconductor substrate 101 is not limited thereto. An active region ACT may include a source/drain region 103, and a channel region 105 provided under a gate structure 102-T1. The source/drain region 103 may include a heavily doped region 103h and a lightly doped region 103l as illustrated in FIG. 14A.

The program transistor T0 may include a gate structure 102-T0, a spacer 130, and a source/drain region 103 as illustrated in FIG. 14A. The gate structure 102-T0 may include a gate oxide layer 121/123 contacting the semiconductor substrate 101, and at least one metal layer 120m stacked on the gate oxide layer 121/123. The gate oxide layer 121/123 may include, for example, an interface layer 121 and a high dielectric layer 123.

The spacer 130 may be provided at two sides of the gate structure 102-T0, and may be formed of an insulating material such as oxide, nitride, or oxinitride.

The source/drain region 103 may serve as a current path in the program transistor T0 and may not be a general source/drain region. However, since the source/drain region 103 is also used by the read transistor T1, the source/drain region 103 may correspond to a normal source/drain region in the read transistor T1. Additionally, as illustrated in FIG. 14A, in the program transistor T0, an isolation layer 150 may be provided instead of a source/drain region at a side of the gate structure 102-T0. By providing the isolation layer 150 as described above, a terminal of the program transistor T0 is floated (see FIG. 2A). In some cases, the program transistor T0 may be a depletion-type transistor having a source and a drain connected to each other (see FIG. 2B).

The read transistor T1 may include the gate structure 102-T1, the spacer 130, the source/drain region 103, and the channel region 105 as illustrated in FIG. 14A. The read transistor T1 may also be called an access transistor or a pass transistor. The gate structure 120-T1 and the spacer 130 may have the same structures and materials as those of the gate structure 120-T0 and the spacer 130 of the program transistor T0.

The source/drain region 103 may be provided on the semiconductor substrate 101 at two sides of the gate structure 120-T1, and the channel region 105 may be provided on the semiconductor substrate 101 between a source and a drain under the gate structure 120-T1. Also, as illustrated, a bit line 107 may contact the source/drain region 103, e.g., the drain region.

Referring to FIG. 14B, the OTP cell OTPC_b may include a program transistor T0 and a read transistor Ti having a FinFET structure. For example, the program transistor T0 may include three active fins F1, F2, and F3 and a gate structure 102-T0, and the read transistor T1 may include the three active fins F1, F2, and F3 and a gate structure 102-T1.

The active fins F1, F2, and F3 may protrude upward from a semiconductor substrate and extend in one direction as illustrated in FIG. 14B. The active fins F1, F2, and F3 may correspond to the active region ACT of FIG. 14A. Accordingly, the active fins F1, F2, and F3 may include a source/drain region and a channel region. A bit line 107 may contact the active fins F1, F2, and F3. The three active fins F1, F2, and F3 may configure one unit cell in the OTP cell OTPC_b of the current embodiment, but the number of active fins for configuring a unit cell is not limited to three. For example, one or two active fins may configure a unit cell, or four or more active fins may configure a unit cell.

Each of the gate structures 102-T0 and 102-T1 may cover top and side surfaces of the active fins F1, F2, and F3 and extend in one direction across the active fins F1, F2, and F3. Each of the gate structures 102-T0 and 102-T1 may include a gate oxide layer and at least one metal layer. In addition, the gate structure 102-T0 of the program transistor T0 and the gate structure 102-T1 of the read transistor T1 may have the same structure.

Figure 15:
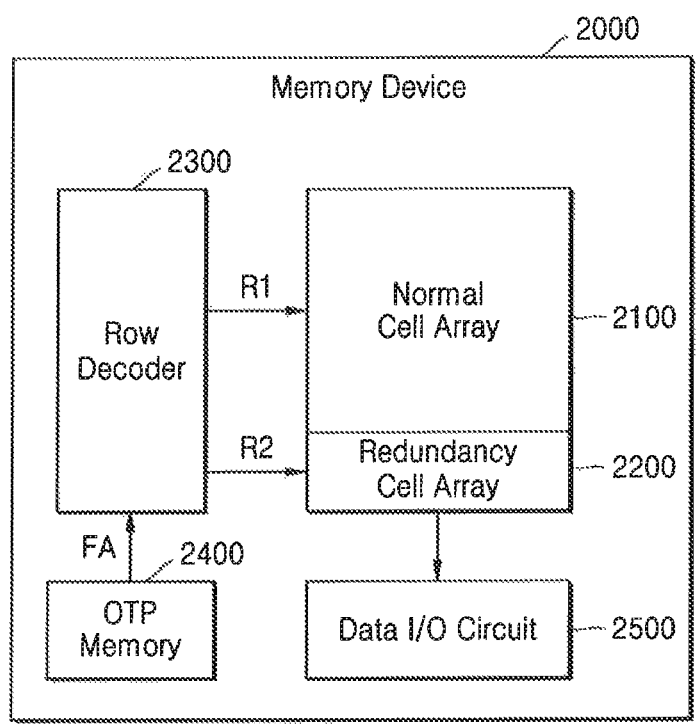
FIG. 15 is a block diagram of a memory device including an OTP memory, according to an exemplary embodiment of the inventive concept.

FIG. 15 is a block diagram of a memory device 2000 including an OTP memory 2400, according to an exemplary embodiment of the inventive concept. The OTP memory 2400 may be included in the memory device 2000, and may store information about defective memory cells of the memory device 2000 in a non-volatile manner. Referring to FIG. 15, the memory device 2000 may include a normal cell array 2100, a redundancy cell array 2200, a row decoder 2300, the OTP memory 2400, and a data input/output (I/O) circuit 2500.

The normal cell array 2100 and the redundancy cell array 2200 may include a plurality of memory cells. For example, the memory device 2000 may be, but not limited to, a volatile memory device such as dynamic random access memory (DRAM), static random access memory (SRAM), mobile DRAM, double data rate synchronous dynamic random access memory (DDR SDRAM), low power DDR (LPDDR) SDRAM, graphic DDR (GDDR) SDRAM, or rambus dynamic random access memory (RDRAM), and the normal cell array 2100 and the redundancy cell array 2200 may include a plurality of volatile memory cells. As another example, the memory device 2000 may be, but not limited to, a non-volatile memory device such as electrically erasable programmable read-only memory (EEPROM), flash memory, phase change random access memory (PRAM), resistive random access memory (RRAM), nano-floating gate memory (NFGM), polymer random access memory (PoRAM), magnetic random access memory (MRAM), or ferroelectric random access memory (FRAM), and the normal cell array 2100 and the redundancy cell array 2200 may include a plurality of non-volatile memory cells.

The normal cell array 2100 may include defective memory cells incapable of normally writing or reading data. This may be due to a manufacturing process, for example. The memory device 2000 may store information about the defective memory cells in the OTP memory 2400, and thus, the defective memory cells may be replaced by memory cells included in the redundancy cell array 2200. As such, disuse of the memory device 2000 due to the defective memory cells may be prevented.

The row decoder 2300 may receive a signal FA indicating the locations of the defective memory cells in the cell array 2100, from the OTP memory 2400, generate a first or second row signal (R1 or R2) based on an address signal received from the outside of the memory device 2000 and the signal FA output from the OTP memory 2400, and transmit the first or second row signal to the normal cell array 2100 or the redundancy cell array 2200. For example, if the received address signal equals the signal FA output from the OTP memory 2400, the row decoder 2300 may generate the second row signal R2 and transmit the second row signal R2 to the redundancy cell array 2200, and a signal corresponding to data stored in the memory cells included in the redundancy cell array 2200 may be transmitted to the data I/O circuit 2500.

The data I/O circuit 2500 may detect a signal output from the normal cell array 2100 and the redundancy cell array 2200 through a bit line, or apply a signal to a bit line to write data received from an external device, in the memory cells included in the normal cell array 2100 and the redundancy cell array 2200.

The OTP memory 2400 may write multibit input data DIN<m:1> in a plurality of OTP cells in response to a write command, as described above. The OTP memory 2400 may select one bit line to program a selected OTP cell, and then, select another bit line if the selected OTP cell is completely programmed, thereby sequentially programming a plurality of OTP cells. As such, since the number of program operations, e.g., a programming time, of each OTP cell is variably applicable, a data writing time may be reduced and over programming of the OTP cell may be prevented. Accordingly, a writing time of the OTP memory 2400 may be reduced, reliability thereof may be increase, and thus, reliability and operational characteristics of the memory device 2000 including the OTP memory 2400 may be increased.

Figure 16:
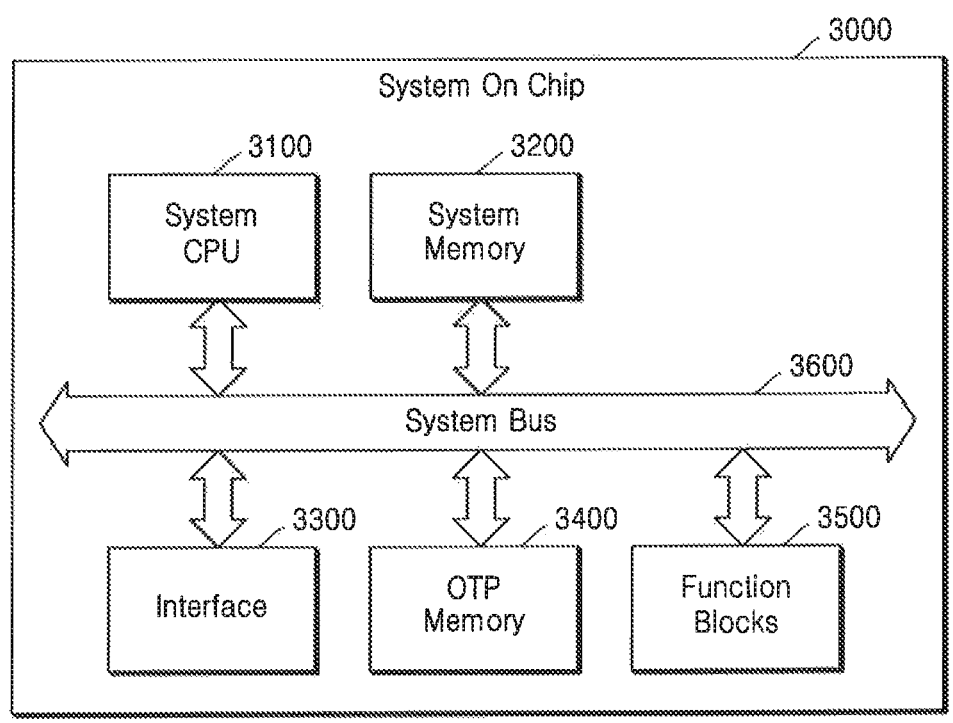
FIG. 16 is a block diagram of a system on chip (SoC) including an OTP memory device, according to an exemplary embodiment of the inventive concept.

FIG. 16 is a block diagram of a system on chip (SoC) 3000 including an OTP memory device, according to an exemplary embodiment of the inventive concept.

Referring to FIG. 16, the SoC 3000 may include a system central processing unit (CPU) 3100, a system memory 3200, an interface 3300, an OTP memory 3400, function blocks 3500, and a system bus 3600 for interconnecting the elements of the SoC 3000. The system CPU 3100 controls operation of the SoC 3000. The system CPU 3100 may include a core and a level 2 (L2) cache. For example, the system CPU 3100 may include multiple cores. The multiple cores may have the same or different performance levels. In addition, the multiple cores may be activated with the same or different timings. The system memory 3200 may store data processed by the function blocks 3500 under control of the system CPU 3100. For example, data stored in the L2 cache of the system CPU 3100 may be flushed, and thus, stored in the system memory 3200. The interface 3300 may interface with external devices. For example, the interface 3300 may interface with a camera, a liquid crystal display (LCD), and a speaker.

The OTP memory 3400 may store setup information of the SoC 3000. The OTP memory 3400 may be the OTP memory 100, 100a, or 100b described above with reference to FIGS. 1 to 13. For example, the OTP memory 3400 may include the write circuit 120 or 120b according to an exemplary embodiment of the inventive concept. Therefore, the OTP memory 3400 may increase reliability of the SoC 3000. The function blocks 3500 may perform a variety of functions required by the SoC 3000. For example, the function blocks 3500 may code or decode video data or process three-dimensional (3D) graphic data.

Figure 17:
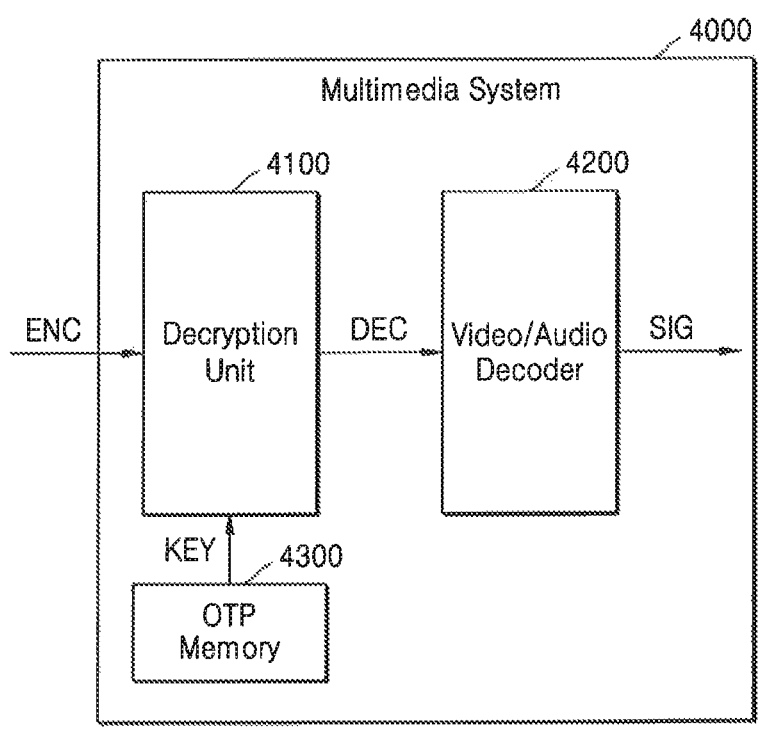
FIG. 17 is a block diagram of a multimedia system according to an exemplary embodiment of the inventive concept.

FIG. 17 is a block diagram of a multimedia system 4000 according to an exemplary embodiment of the inventive concept. As illustrated in FIG. 17, the multimedia system 4000 such as a smart TV or a set-top box may include a decryption unit 4100, a video/audio decoder 4200, and an OTP memory 4300.

The decryption unit 4100 may decrypt an encrypted signal ENC and output a decrypted signal DEC. The video/audio decoder 4200 may decode the decrypted signal DEC corresponding to compressed data, thereby outputting a multimedia signal SIG.

According to an exemplary embodiment of the inventive concept, the OTP memory 4300 may store and output a decryption key KEY used when the decryption unit 4100 decrypts the encrypted signal ENC. The decryption key KEY may be programmed in the OTP memory 4300 in a manufacturing procedure of the multimedia system 4000, and may be protected from unauthorized external access. The OTP memory 4300 may be the OTP memory 100, 100a, or 100b described above with reference to FIGS. 1 to 13. For example, the OTP memory 3400 may include the write circuit 120 or 120b according to an exemplary embodiment of the inventive concept. Therefore, reliability of the multimedia system 4000 may be increased.

Figure 18:
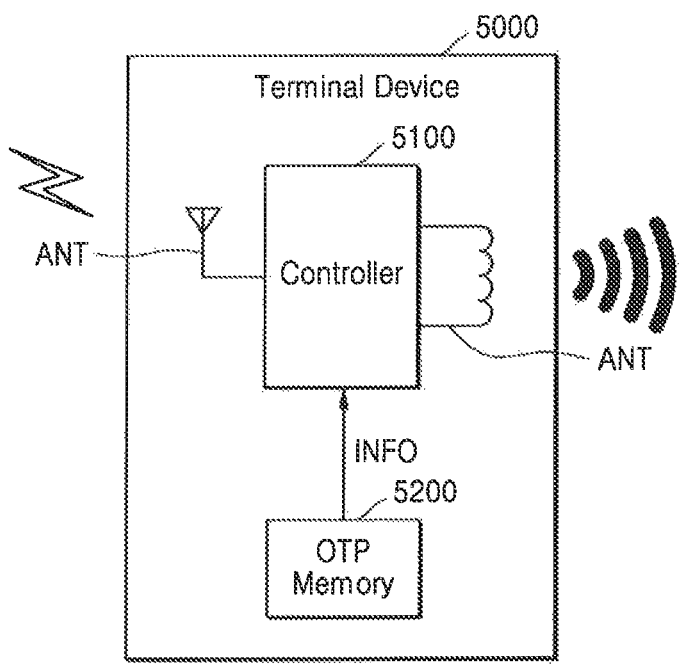
FIG. 18 is a block diagram of a terminal device including an OTP memory, according to an exemplary embodiment of the inventive concept.

FIG. 18 is a block diagram of a terminal device 5000 including an OTP memory 5200, according to an exemplary embodiment of the inventive concept. As illustrated in FIG. 18, the terminal device 5000 may include a controller 5100, the OTP memory 5200, and antennas ANT. The antennas ANT may generate or receive signals for wireless mobile communication such as long term evolution (LTE), or short-range wireless communication such as near field communication (NFC) or Bluetooth, under control of the controller 5100.

According to an exemplary embodiment of the inventive concept, the OTP memory 5200 may store private information INFO of a user of the terminal device 5000. For example, the OTP memory 5200 may store payment information, bank account information, authentication information, and healthcare information of the user, and the controller 5100 may transmit the private information INFO through the antennas ANT to another electronic device in a secure fashion. When the controller 5100 and the OTP memory 5200 are implemented as one chip, e.g., an embedded secure element (eSE), the private information INFO may be protected from unauthorized external access.

The OTP memory 5200 may be the OTP memory 100, 100a, or 100b described above with reference to FIGS. 1 to 13. For example, the OTP memory 5200 may include the write circuit 120 or 120b according to an exemplary embodiment of the inventive concept. Therefore, reliability of the terminal device 5000 may be increased.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A one time programmable (OTP) memory, comprising:
   an OTP cell array comprising a plurality of OTP cells provided at locations where a plurality of word lines and a plurality of bit lines cross each other; and
   a write circuit configured to sequentially program the OTP cells by selecting the bit lines one at a time and programming a selected OTP cell connected to the selected bit line,
   wherein the write circuit is further configured to detect a voltage level of the selected bit line and select another bit line when the detected voltage level indicates that the selected OTP cell is in a programmed state.

2. The OTP memory of claim 1, wherein the write circuit is configured to continue to program the selected OTP cell when the detected voltage level indicates that the selected OTP cell is not in the programmed state.

3. The OTP memory of claim 2, wherein the write circuit is configured to program the selected OTP cell during a preset unit programming time.

4. The OTP memory of claim 1, wherein the write circuit comprises:
a bit line switching circuit configured to select the bit lines one at a time in response to a bit line selection signal, and generate a program completion signal in response to the detected voltage level of the selected bit line; and
a program control circuit configured to generate the bit line selection signal in response to the program completion signal.

5. The OTP memory of claim 4, wherein the bit line switching circuit comprises:
a plurality of switches individually connected to the bit lines and configured to operate in response to bits of the bit line selection signal corresponding to the switches; and
a level detector configured to detect the voltage level of the selected bit line and output a result of the detection.

6. The OTP memory of claim 4, wherein the program control circuit is configured to generate the bit line selection signal in response to received input data.

7. The OTP memory of claim 4, wherein the program control circuit is configured to increase a value of the bit line selection signal in response to the program completion signal.

8. The OTP memory of claim 4, wherein the program control circuit is configured to generate a program enable signal for controlling a program period and a detection enable signal indicating a period for detecting the voltage level of the selected bit line, in response to a write command.

9. The OTP memory of claim 8, wherein the detection enable signal is activated after a predetermined waiting time that starts from a time when the program enable signal is deactivated.

10. The OTP memory of claim 8, wherein the program control circuit is configured to generate the program enable signal for controlling the bit line switching circuit to program the OTP cells multiple times, in response to the write command.

11. The OTP memory of claim 1, wherein the write circuit is configured to program the OTP cells multiple times in response to a write command received from an external device.

12. The OTP memory of claim 1, further comprising a control logic circuit configured to provide a write command to the write circuit.

13. The OTP memory of claim 12, wherein the write circuit is configured to provide a monitoring signal indicating a program status of the OTP cells to the control logic circuit.

14. The OTP memory of claim 13, wherein the control logic circuit is configured to change a number of program cycles, a unit programming time, or a total programming time in response to the monitoring signal.

15. A data writing method of a one time programmable (OTP) memory configured to write multibit input data in a plurality of OTP cells, the method comprising:
receiving the multibit input data and a write command;
selecting one of a plurality of bit lines connected to the OTP cells, and writing a data value of the multibit input data in a selected OTP cell connected to the selected bit line;
detecting a voltage level of the selected bit line; and
selecting another of the bit lines when the detected voltage level indicates that the selected OTP cell is in a state corresponding to the data value.

16. The data writing method of claim 15, further comprising:
continuing to write the data value in the selected OTP cell when the detected voltage level indicates that the selected OTP cell is not in the state corresponding to the data value.

17. The data writing method of claim 15, further comprising generating a program completion signal if the voltage level of the selected bit line is in a logic high state.

18. The data writing method of claim 15, wherein the writing of the data value is performed during a preset unit writing time.

19. The data writing method of claim 15, further comprising sequentially writing data values of the multibit input data in the OTP cells connected to the bit lines.

20. A one time programmable (OTP) memory, comprising:
a cell array comprising a plurality of cells, a plurality of wordlines and a plurality of bit lines; and
a write circuit configured to program a first cell of a first bit line, generate a first program complete signal when a voltage level of a sensing node of the write circuit indicates the first cell has a logic high level, and program a second cell of a second bit line in response to the first program complete signal.

* * * * *